United States Patent [19]

Kim et al.

[11] Patent Number: 5,459,428
[45] Date of Patent: Oct. 17, 1995

[54] SWITCH CIRCUIT FOR MONOLITHIC MICROWAVE INTEGRATED CIRCUIT DEVICE

[75] Inventors: Min-Gun Kim; Choong-Hwan Kim; In-Gab Hwang; Chang-Seok Lee; Hyung-Moo Park, all of Daejeon, Rep. of Korea

[73] Assignee: Electronics & Telecommunications Research Institute, Daejohn-shi, Rep. of Korea

[21] Appl. No.: 359,207

[22] Filed: Dec. 19, 1994

[51] Int. Cl.⁶ ............... H03K 17/16; H03K 17/687; H03K 5/22; H03K 9/08
[52] U.S. Cl. .......... 327/387; 327/388; 327/389; 327/427; 327/434; 326/25; 326/33; 326/34; 330/277
[58] Field of Search .................. 327/427, 430, 327/431, 434, 435, 551, 552, 553, 554, 389, 388, 387; 326/21, 23, 25, 26, 27, 33, 34; 330/277

[56] References Cited

U.S. PATENT DOCUMENTS

| | | | |
|---|---|---|---|
| 3,789,246 | 1/1974 | Preisig et al. | 330/277 |
| 4,734,751 | 3/1988 | Hwang et al. | 330/277 |
| 5,338,989 | 8/1994 | Tanino | 327/427 |
| 5,387,880 | 2/1995 | Kobayashi | 330/277 |

Primary Examiner—Timothy P. Callahan
Assistant Examiner—Trong Phan
Attorney, Agent, or Firm—Antonelli, Terry, Stout & Kraus

[57] ABSTRACT

Disclosed is a switch circuit which has a depletion mode n-channel MOSFET which can be used in a circuit allowing only a positive voltage to be supplied thereto, comprising a first D-FET having a gate for receiving an input signal, a drain for outputting an output signal and a source; a first resistor connected between the drain of the first D-FET and a positive voltage source to bias the drain of the first D-FET; a second D-FET having a gate connected to an intermittence controlling voltage source, a drain and a source connected to the positive voltage source and the source of the first D-FET 201, respectively; a second resistor connected between the gate of the second D-FET and a ground to bias the gate of the second D-FET; a constant-current source connected between each of the sources of the first and second D-FET and the ground; a bypass capacitor connected in parallel with the constant-current source and between the drain of the constant-current source and the ground to bypass an RF signal to the ground; and a third resistor connected between the gate of the first D-FET 201 and the ground to bias the gate of the first D-FET. Since the switch circuit can be operated only by a positive voltage without use of a negative voltage, it can be embodied with a general depletion mode n-channel MOSFET which can be fabricated by a relatively simple fabrication sequence and has a relatively simple structure in comparison with an enhancement mode n-channel MOSFET.

2 Claims, 2 Drawing Sheets

SWITCH CIRCUIT FOR MONOLITHIC MICROWAVE INTEGRATED CIRCUIT DEVICE

BACKGROUND OF THE INVENTION

1. Field of the Invention

The present invention relates to a switch circuit of a monolithic microwave integrated circuit (MMIC) device for controlling intermittence of an input signal, and more particularly to a switch circuit which has a depletion mode n-channel MOSFET (metal oxide semiconductor field effect transistor) which can be used in a circuit allowing only a positive voltage to be supplied therein.

2. Description of the Prior Art

In an MMIC allowing only a positive voltage to be supplied, an enhancement mode n-channel MOSFET must be used as a switch circuit for controlling intermittence of an input signal. It is well-known in this art that such an enhancement mode n-channel MOSFET is complicated in structure and is difficult in fabrication sequence thereof, as compared to a depletion mode MOSFET.

If a depletion mode n-channel MOSFET (hereinafter, referred to as "D-FET") is embodied in an MMIC, as a switch circuit, the MMIC stands in need of a negative voltage in addition to a positive voltage.

FIG. 1 is a circuit diagram of a prior art switch circuit which is constituted by a D-FET.

Referring to FIG. 1, the prior art switch circuit comprises a D-FET 101, a first bias resistor 102 connected between a drain of the D-FET 101 and a positive voltage source Vdd, a second bias resistor 103 connected between a source of the D-FET 101 and a ground, a bypass capacitor 104 connected in parallel with the second bias resistor 103 to bypass an RF (radio frequency) signal to the ground, a gate bias resistor 105 connected between the intermittence controlling voltage source Vc and a gate of the D-FET 101, and a third bias resistor 106 connected between the voltage source Vc and the ground. Also, in FIG. 1, reference characters "Sin" and "Sout" indicate input and output terminals, respectively.

In this switch circuit, an input signal is applied to the gate of the D-FET 101, and an output signal is obtained from the drain of the D-FET 101.

In the prior art switch circuit, if the intermittence controlling voltage Vc greater than a threshold voltage Vt of the D-FET 101 is applied therein, the D-FET 101 is operated as an amplification mode. However, if the voltage Vc less than the threshold voltage Vt thereof is applied therein, it is operated as a cut-off mode. The amplification mode means that the input signal is amplified by the D-FET 101 and outputted through the output terminal Sout, and the cut-off mode means that the input signal is not amplified by the D-FET and not outputted.

As described above, since the threshold voltage Vt of the D-FET 101 is a negative voltage, there arises the problem that the intermittence controlling voltage of a negative voltage is unavoidably required for such a switch circuit.

SUMMARY OF THE INVENTION

It is an object of the present invention to provide a switch circuit with a depletion mode n-channel MOSFET capable of being operated by only a positive voltage in an MMIC device.

According to the aspect of the present invention, the switch circuit for a monolithic microwave integrated circuit device, comprising a first D-FET having a gate for receiving an input signal, a drain for outputting an output signal and a source; a first resistor connected between the drain of the first D-FET and a positive voltage source to bias the drain of the first D-FET; a second D-FET having a gate connected to an intermittence controlling voltage source, a drain and a source connected to the positive voltage source and the source of the first D-FET 201, respectively; a second resistor connected between the gate of the second D-FET and a ground to bias the gate of the second D-FET; a constant-current source connected between each of the sources of the first and second D-FET and the ground; a bypass capacitor connected in parallel with the constant-current source and between the drain of the constant-current source and the ground to bypass an RF signal to the ground; and a third resistor connected between the gate of the first D-FET 201 and the ground to bias the gate of the first D-FET.

In this switch circuit, the constant-current source comprises a third D-FET having a drain connected commonly to the sources of the first and second D-FETs, and a gate and a source which are commonly connected to a ground.

Since the switch Circuit can be operated only by a positive voltage without use of a negative voltage, it can be embodied with a general depletion mode n-channel MOSFET which can be fabricated by a relatively simple fabrication sequence and has a relatively simple structure in comparison with an enhancement mode n-channel MOSFET.

BRIEF DESCRIPTION OF THE DRAWINGS

This invention may be better understood and its object will become apparent to those skilled in the art by reference to the accompanying drawings as follows.

DESCRIPTION OF THE PREFERRED EMBODIMENT(S)

Figure 1:
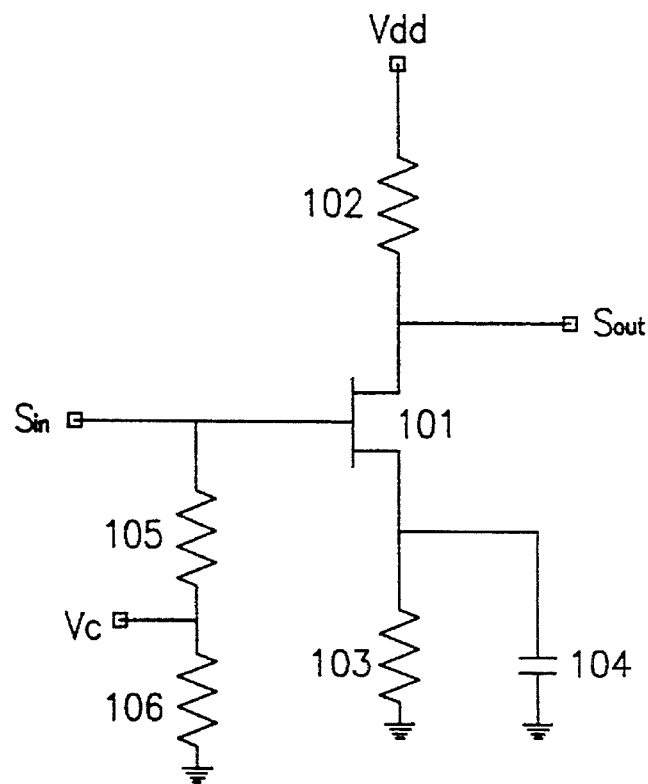
FIG. 1 is a circuit diagram of a prior art switch circuit which is constituted by a D-FET.
Figure 2:
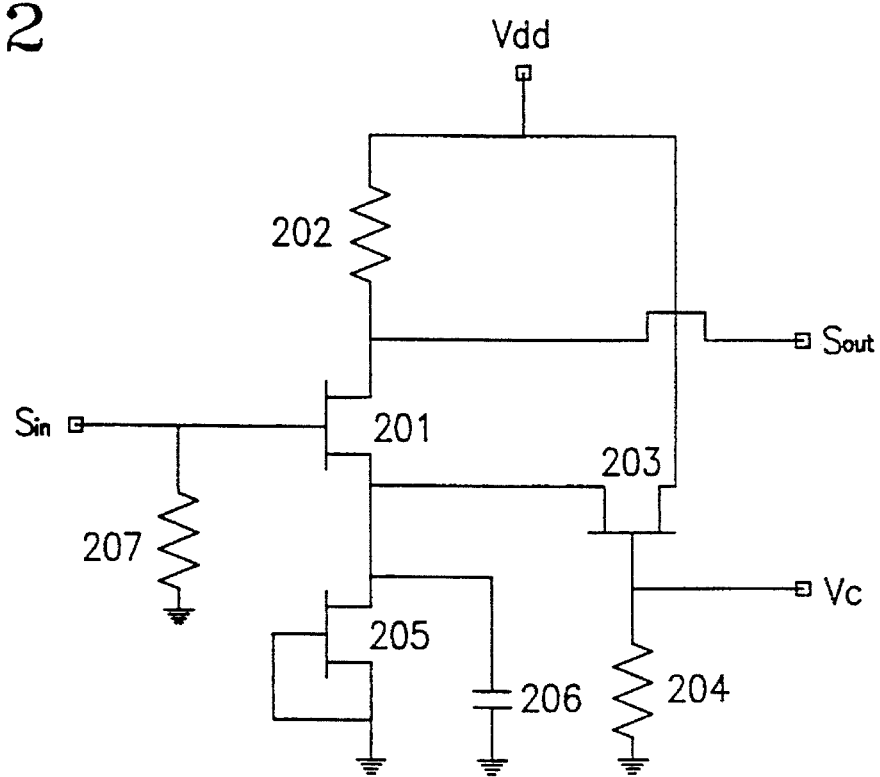
FIG. 2 is a circuit diagram of the switch circuit with a D-FET according to the embodiment of the present invention.

Referring to FIG. 2, the switch circuit of the present invention comprised a first D-FET 201 having a gate for receiving an input signal, a drain for outputting an output signal and a source, a second D-FET 203 having a gate connected to an intermittence controlling voltage source Vc, a drain and a source connected to a positive voltage Source Vdd and the source of the first D-FET 201, respectively, and a third D-FET 205 having a drain connected commonly to the sources of the first and second D-FETs 201, 203, and a gate and a source which are commonly connected to a ground, for serving as a constant-current source. The switch circuit further comprises three resistors, as shown in FIG. 2.

In detail, between the drain of the first D-FET 201 and the positive voltage source Vdd, a first resistor 202 is connected to bias the drain of the first D-FET 201. Between the gate of the second D-FET 203 and the ground, a second resistor 204 is connected to bias the gate of the second D-FET 203, and between the drain of the third D-FET 205 and the ground a bypass capacitor 206 is connected in parallel with the third D-FET 205 to bypass an RF signal to the ground. Between the gate of the first D-FET 201 and the ground, a third resistor 207 is connected to bias the gate of the first D-FET 201. In FIG. 2, reference characters "Sin" and "Sout" indicate input and output terminals, respectively.

In the switch circuit of FIG. 2, if the intermittence controlling voltage Vc is zero-state and a voltage Vs less than an absolute value of the threshold voltage Vt of the first D-FET 201 is biased to the sources of the first and second D-FETs, the first D-FET 201 is operated as an amplifying mode to amplify an input signal Sin to a predetermined gain and output the amplified input signal as the output signal Sour through the output terminal.

In this amplifying mode, a drain-source current Ids of the second D-FET 203 is increased in proportion to the intermittence controlling voltage Vc. Then, since the drain-source current Ids of the third D-FET 205 for serving as a constant-current source is constant, the drain-source current Ids of the first D-FET 201 is reduced by the increased amount of the drain-source current Ids of the third D-FET 205. Therefore, in the first D-FET 201, a source voltage thereof is increased, thereby enabling the drain-source current thereof to be reduced.

In this state, if the source voltage of the first D-FET 201 is greater than the threshold voltage thereof, it is operated as a pinch-off mode, and thus no an output signal is provided from the output terminal Sout.

Figure 3:
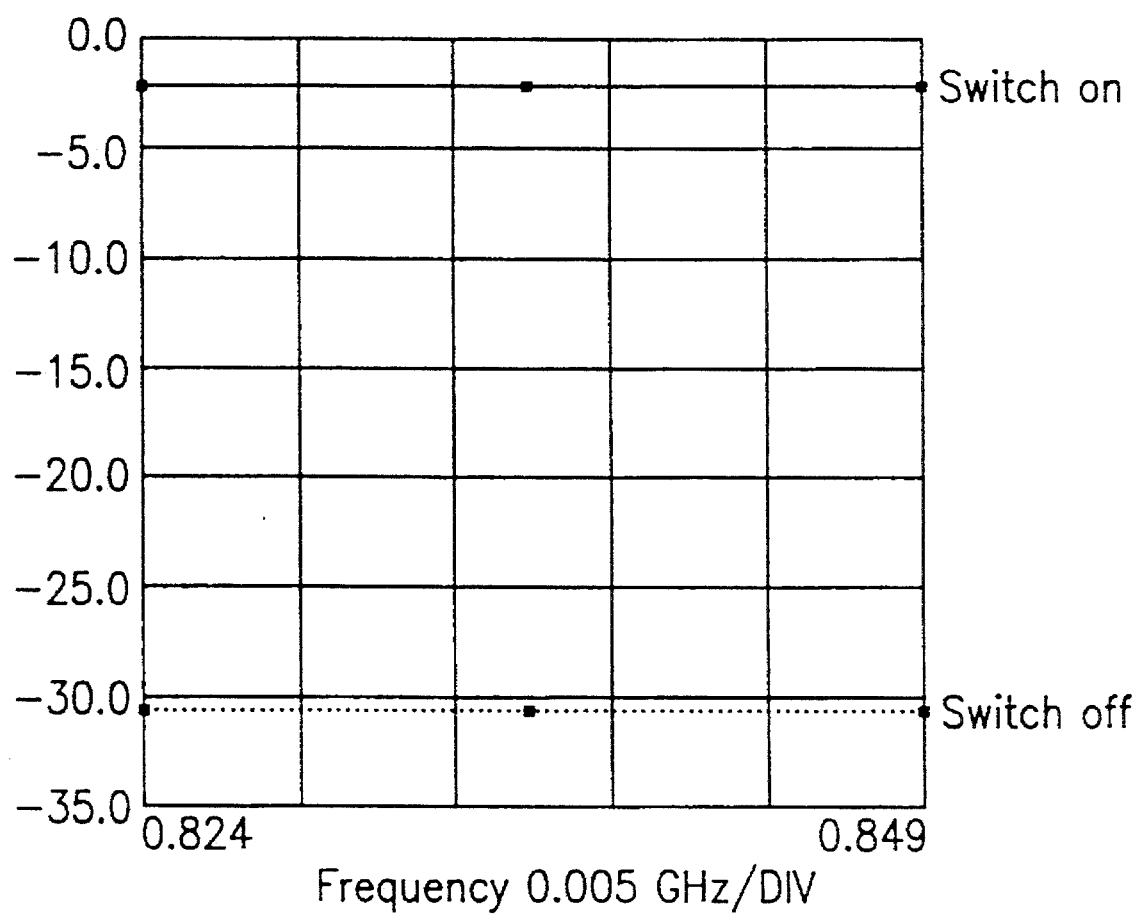
FIG. 3 is a diagram showing a power gain characteristic that the switch circuit of FIG. 2 exists in accordance with an on/off switching operation.

FIG. 3 shows a power gain characteristic of the switch circuit when a frequency of 830 MHz and an input signal of −30 dB are applied to the switch circuit.

As can be seen from FIG. 3, a power gain of switch-off state is less than that of switch-on state. For example, the power gain of switch-off state is −30 dB and the power gain of switch-on state is −2 dB.

As described above, since the switch circuit of the present invention can be operated only by a positive voltage without use of a negative voltage, it can be embodied with a general depletion mode n-channel MOSFET which can be fabricated by a relatively simple fabrication sequence and has a relatively simple structure in comparison with an enhancement mode n-channel MOSFET.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A switch circuit for a monolithic microwave integrated circuit device, comprising:

a first depletion mode n-channel MOSFET having a gate for receiving an input signal, a drain for outputting an output signal and a source;

a first resistor connected between the drain of the first depletion mode n-channel MOSFET and a positive voltage source to bias the drain of the first depletion mode n-channel MOSFET;

a second depletion mode n-channel MOSFET having a gate connected to an intermittence controlling voltage source, a drain and a source connected to the positive voltage source and the source of the first depletion mode n-channel MOSFET, respectively;

a second resistor connected between the gate of the second depletion mode n-channel MOSFET and a ground to bias the gate of the second depletion mode n-channel MOSFET;

a constant-current source connected between each of the sources of the first and second depletion mode n-channel MOSFET and the ground;

a bypass capacitor connected in parallel with the constant-current source and between the drain of the constant-current source and the ground to bypass an RF signal to the ground; and a third resistor connected between the gate of the first depletion mode n-channel MOSFET 201 and the ground to bias the gate of the first depletion mode n-channel MOSFET.

2. The switch circuit as defined in claim 1, wherein the constant-current source comprises a third depletion mode n-channel MOSFET having a drain connected commonly to the sources of the first and second depletion mode n-channel MOSFETs, and a gate and a source which are commonly connected to a ground.

\* \* \* \* \*